United States Patent
Maruyama et al.

(10) Patent No.: US 11,156,919 B2
(45) Date of Patent: Oct. 26, 2021

(54) PHOTOSENSITIVE RESIN COMPOSITION, PATTERN FORMING PROCESS, AND FABRICATION OF OPTO-SEMICONDUCTOR DEVICE

(71) Applicant: Shin-Etsu Chemical Co., Ltd., Tokyo (JP)

(72) Inventors: Hitoshi Maruyama, Annaka (JP); Kazunori Kondo, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 81 days.

(21) Appl. No.: 16/232,377

(22) Filed: Dec. 26, 2018

(65) Prior Publication Data

US 2019/0196331 A1   Jun. 27, 2019

(30) Foreign Application Priority Data

Dec. 27, 2017   (JP) .............................. JP2017-251774

(51) Int. Cl.

| | | |
|---|---|---|
| *G03F 7/075* | (2006.01) | |
| *G03F 7/30* | (2006.01) | |
| *C08G 77/12* | (2006.01) | |
| *C08G 77/20* | (2006.01) | |
| *H01L 21/027* | (2006.01) | |
| *C08L 63/00* | (2006.01) | |
| *C08G 59/30* | (2006.01) | |
| *G03F 7/038* | (2006.01) | |
| *G03F 7/32* | (2006.01) | |
| *G03F 7/16* | (2006.01) | |
| *G03F 7/20* | (2006.01) | |

(52) U.S. Cl.
CPC ......... *G03F 7/0757* (2013.01); *C08G 59/306* (2013.01); *C08G 77/12* (2013.01); *C08G 77/20* (2013.01); *C08L 63/00* (2013.01); *G03F 7/038* (2013.01); *G03F 7/0755* (2013.01); *G03F 7/30* (2013.01); *H01L 21/0274* (2013.01); *G03F 7/16* (2013.01); *G03F 7/20* (2013.01); *G03F 7/32* (2013.01)

(58) Field of Classification Search
CPC ......... G03F 7/0757; G03F 7/0758; G03F 7/30
See application file for complete search history.

(56) References Cited

U.S. PATENT DOCUMENTS

| | | | | |
|---|---|---|---|---|
| 4,049,861 A | * | 9/1977 | Nozari ..................... | C09D 4/00 428/220 |
| 4,293,606 A | * | 10/1981 | Zollinger ............... | G03C 11/06 428/203 |
| 5,260,349 A | | 11/1993 | Crivello | |
| 5,364,888 A | * | 11/1994 | Aoki ....................... | C08K 5/06 522/170 |
| 5,844,053 A | * | 12/1998 | Nishida ................... | C08L 63/00 525/476 |
| 8,715,905 B2 | | 5/2014 | Tagami et al. | |
| 9,464,172 B2 | * | 10/2016 | Ide ......................... | C08G 77/388 |
| 2007/0172759 A1 | * | 7/2007 | Ogihara ................. | G03F 7/0757 430/270.1 |
| 2008/0026182 A1 | | 1/2008 | Abe et al. | |
| 2014/0255832 A1 | * | 9/2014 | Qiu ......................... | C08G 77/16 430/5 |

FOREIGN PATENT DOCUMENTS

| | | |
|---|---|---|
| EP | 0389927 A2 | 10/1990 |
| EP | 0449027 A2 | 10/1991 |
| EP | 0507493 A1 | 10/1992 |
| EP | 2397508 A1 | 12/2011 |
| JP | 2008-32763 A | 2/2008 |
| JP | 2012-1668 A | 1/2012 |
| WO | 92/12183 A1 | 7/1992 |

OTHER PUBLICATIONS

Crivello J V et al: "The Synthesis, Characterization, and Photoinitiated Cationic Polymerization of Silicon-Containing Epoxy Resins", Journal of Polymer Science, Polymer Chemistry Edition, Interscience Publishers, New York, NY, US, vol. 28, No. 3, Feb. 1, 1990, pp. 179-503, XP000141356; Cited in Extend European Search Report dated Apr. 12, 2019. (25 pages).

Extended European Search Report dated Apr. 12, 2019, issued in counterpart EP Application No. 18215199.3. (9 pages).

* cited by examiner

*Primary Examiner* — John S Chu
(74) *Attorney, Agent, or Firm* — Westerman, Hattori, Daniels & Adrian, LLP

(57) ABSTRACT

A photosensitive resin composition comprising a dual end alicyclic epoxy-modified silicone resin having formula (A1) and a photoacid generator is provided. In formula (A1), $R^1$ to $R^4$ are a $C_1$-$C_{20}$ monovalent hydrocarbon group and n is an integer of 1-600. The composition enables pattern formation using radiation of widely varying wavelength, and the patterned film has high transparency, light resistance, and heat resistance.

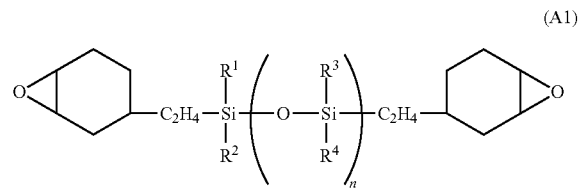

(A1)

8 Claims, No Drawings

PHOTOSENSITIVE RESIN COMPOSITION, PATTERN FORMING PROCESS, AND FABRICATION OF OPTO-SEMICONDUCTOR DEVICE

CROSS-REFERENCE TO RELATED APPLICATION

This non-provisional application claims priority under 35 U.S.C. § 119(a) on Patent Application No. 2017-251774 filed in Japan on Dec. 27, 2017, the entire contents of which are hereby incorporated by reference.

TECHNICAL FIELD

This invention relates to a photosensitive resin composition, a pattern forming process, and a method for fabricating an opto-semiconductor device.

BACKGROUND ART

Heretofore, epoxy resins are mainly used as the encapsulating/protecting material for optical devices, typically light-emitting diodes (LEDs) and CMOS image sensors. Among others, epoxy-modified silicone resins are mostly used because of high transparency and light resistance. For example, a silicone resin having an alicyclic epoxy group introduced in the silphenylene structure is known from Patent Document 1. However, these materials are not amenable to micro-processing to a size of the order of 10 nm.

Nowadays, many types of optical devices are produced by the micro-processing technology. For the micro-processing purpose, various resist materials as typified by epoxy resin-based materials are used. These materials clear the level of light resistance needed for prior art devices, but fail to clear the level of light resistance needed for advanced optical devices such as LEDs which are currently designed to produce higher outputs. They also suffer from outgassing and discoloration. Patent Document 2 discloses a photocurable composition comprising a dual end alicyclic epoxy-modified silphenylene as crosslinker. For the goal of higher transparency, this composition is still insufficient in heat resistance and light resistance. There is a need for a composition which withstands severer conditions.

CITATION LIST

Patent Document 1: JP-A 2008-032763 (US 20080026182)
Patent Document 2: JP-A 2012-001668 (U.S. Pat. No. 8,715,905, EP 2397508)

DISCLOSURE OF INVENTION

An object of the invention is to provide a photosensitive resin composition which enables pattern formation using radiation of widely varying wavelength, and forms a patterned film having high transparency, light resistance, and heat resistance; a pattern forming process using the resin composition; and a method for fabricating an opto-semiconductor device.

The inventors have found that a photosensitive resin composition containing a specific alicyclic epoxy-modified silicone resin is easy to form a film, and the film exhibits improved transparency and light resistance and is excellent in micropatterning performance and thus effective in the protecting and encapsulating applications associated with opto-semiconductor devices.

In one aspect, the invention provides a photosensitive resin composition comprising (A) a dual end alicyclic epoxy-modified silicone resin having the following formula (A1) and (B) a photoacid generator.

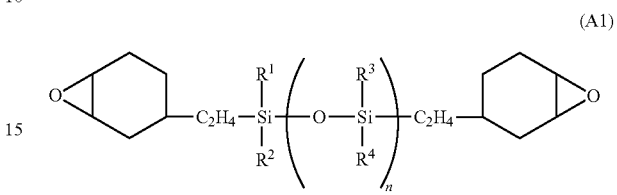

(A1)

Herein $R^1$ to $R^4$ are each independently a $C_1$-$C_{20}$ monovalent hydrocarbon group which may contain a heteroatom, n is an integer of 1 to 600, with the proviso that when n is an integer of at least 2, groups $R^3$ may be identical or different and groups $R^4$ may be identical or different.

Preferably the photosensitive resin composition may further comprise (C) an epoxy-containing silicone resin comprising repeating units having the following formulae (C1) to (C6).

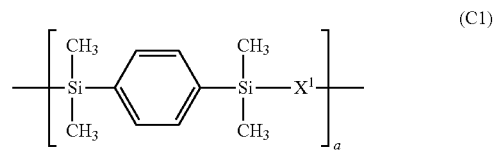

(C1)

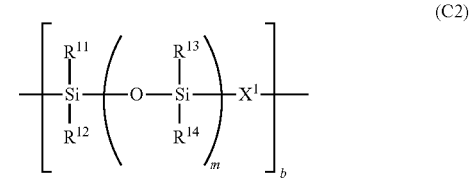

(C2)

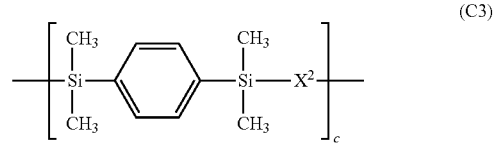

(C3)

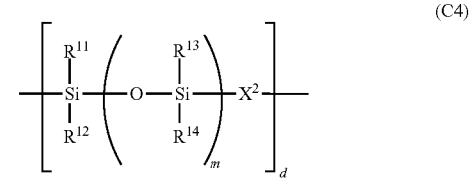

(C4)

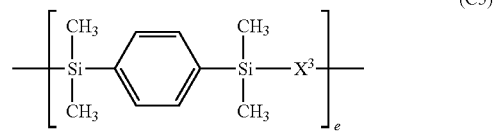

(C5)

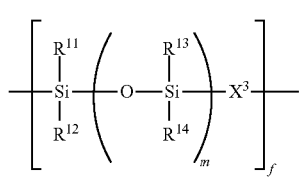

(C6)

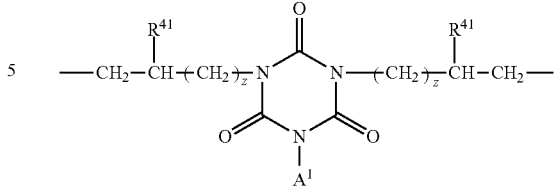

(X3)

Herein $R^{11}$ to $R^{14}$ are each independently a $C_1$-$C_{20}$ monovalent hydrocarbon group which may contain a heteroatom, m is each independently an integer of 1 to 600, with the proviso that when m is an integer of at least 2, groups $R^{13}$ may be identical or different and groups $R^{14}$ may be identical or different, a, b, c, d, e and f are numbers in the range: $0 \le a \le 1$, $0 \le b \le 1$, $0 \le c \le 1$, $0 \le d \le 1$, $0 \le e \le 1$, $0 \le f \le 1$, $0 < c+d+e+f \le 1$, and $a+b+c+d+e+f=1$. $X^1$ is a divalent group having the formula (X1):

wherein $R^{41}$ is each independently hydrogen or methyl, z is each independently an integer of 0 to 7, and $A^1$ is a monovalent group having the formula (X3-1) or (X3-2):

(X3-1)

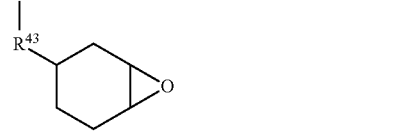

(X3-2)

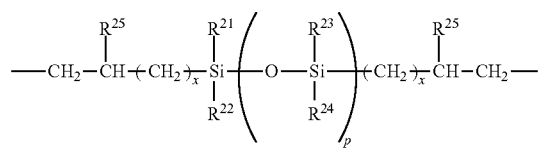

(X1)

wherein $R^{21}$ to $R^{24}$ are each independently a $C_1$-$C_{20}$ monovalent hydrocarbon group which may contain a heteroatom, p is an integer of 1 to 600, with the proviso that when p is an integer of at least 2, groups $R^{23}$ may be identical or different and groups $R^{24}$ may be identical or different, $R^{25}$ is each independently hydrogen or methyl, x is each independently an integer of 0 to 7. $X^2$ is a divalent group having the formula (X2):

wherein $R^{42}$ and $R^{43}$ are each independently a $C_1$-$C_8$ divalent hydrocarbon group in which an ester bond or ether bond may intervene between carbon atoms.

More preferably, e and f are in the range: $0 < e+f \le 1$.

In a preferred embodiment, component (C) is present in an amount of 0 to 10,000 parts by weight per 100 parts by weight of component (A), and component (B) is present in an amount of 0.05 to 20 parts by weight per 100 parts by weight of components (A) and (C) combined.

The photosensitive resin composition may further comprise (D) a solvent and/or (E) an antioxidant.

In another aspect, the invention provides a pattern forming process comprising the steps of (i) coating the photosensitive resin composition defined above onto a substrate to form a photosensitive film thereon, (ii) exposing the photosensitive film to radiation through a photomask, and (iii) developing the exposed film in a developer.

In a further aspect, the invention provides a method for fabricating an opto-semiconductor device involving the pattern forming process, the device comprising the patterned photosensitive resin film.

Advantageous Effects of Invention

The photosensitive resin composition containing a specific alicyclic epoxy-modified silicone resin can be exposed to radiation of widely varying wavelength, effectively coated to form a film without undergoing oxygen inhibition, and processed to form a fine pattern. The cured film of the composition exhibits excellent transparency, light resistance, and heat resistance, and is thus effective in the protecting and encapsulating applications associated with optical devices and the like.

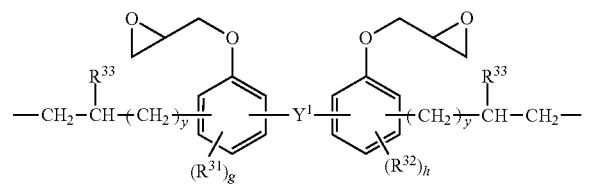

(X2)

wherein $Y^1$ is a single bond, methylene, propane-2,2-diyl, 1,1,1,3,3,3-hexafluoropropane-2,2-diyl, or fluorene-9,9-diyl, $R^{31}$ and $R^{32}$ are each independently a $C_1$-$C_4$ alkyl or alkoxy group, g and h are each independently 0, 1 or 2, with the proviso that groups $R^{31}$ may be identical or different when g is 2, and groups $R^{32}$ may be identical or different when h is 2, $R^{33}$ is each independently hydrogen or methyl, y is each independently an integer of 0 to 7. $X^3$ is a divalent group having the formula (X3):

DESCRIPTION OF PREFERRED EMBODIMENTS

The notation (Cn-Cm) means a group containing from n to m carbon atoms per group. "Optional" or "optionally"

means that the subsequently described event or circumstances may or may not occur, and that description includes instances where the event or circumstance occurs and instances where it does not. PAG stands for photoacid generator.

Photosensitive Resin Composition

Briefly stated, the invention provides a photosensitive resin composition comprising (A) a dual end alicyclic epoxy-modified silicone resin and (B) a photoacid generator, and optionally (C) an epoxy-containing silicone resin, (D) a solvent, and (E) an antioxidant.

(A) Epoxy-Modified Silicone Resin

Component (A) is a dual end alicyclic epoxy-modified silicone resin having the formula (A1).

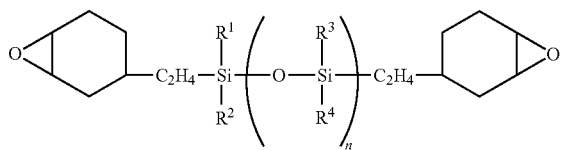

(A1)

In formula (A1), $R^1$ to $R^4$ are each independently a $C_1$-$C_{20}$ monovalent hydrocarbon group which may contain a heteroatom, n is an integer of 1 to 600, with the proviso that when n is an integer of at least 2, groups $R^3$ may be identical or different and groups R may be identical or different. In formula (A1), where at least two siloxane units are included, i.e., n is an integer of at least 2, the siloxane units may be all identical or at least two different siloxane units may be included. Where at least two different siloxane units are included, the siloxane units may be bonded randomly or alternately, or a plurality of blocks each consisting of identical siloxane units may be included.

The monovalent hydrocarbon groups may be straight, branched or cyclic and include monovalent aliphatic hydrocarbon groups such as $C_1$-$C_{20}$ alkyl groups and $C_2$-$C_{20}$ alkenyl groups, and monovalent aromatic hydrocarbon groups such as $C_6$-$C_2$ aryl groups and $C_7$-$C_{20}$ aralkyl groups.

Suitable alkyl groups include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, norbornyl and adamantyl. Suitable alkenyl groups include vinyl, propenyl, butenyl and pentenyl.

In the monovalent aliphatic hydrocarbon groups, a carbonyl moiety, ether bond or thioether bond may intervene between carbon atoms. Typical of such group is 2-oxocyclohexyl. Also in the monovalent aliphatic hydrocarbon groups, one or more or all hydrogen atoms may be substituted by halogen atoms such as fluorine, chlorine, bromine and iodine.

Suitable aryl groups include phenyl, 2-methylphenyl, 3-methylphenyl, 4-methylphenyl, 2-ethylphenyl, 3-ethylphenyl, 4-ethylphenyl, 4-tert-butylphenyl, 4-butylphenyl, dimethylphenyl, naphthyl, biphenylyl, and terphenylyl. Suitable aralkyl groups include benzyl and phenethyl.

In the monovalent aromatic hydrocarbon groups, one or more or all hydrogen atoms may be substituted by $C_1$-$C_{10}$ alkoxy, $C_1$-$C_{10}$ alkylthio, $C_6$-$C_{20}$ aryloxy or $C_6$-$C_{20}$ arylthio groups.

Suitable $C_1$-$C_{10}$ alkoxy groups include methoxy, ethoxy, n-propyloxy, isopropyloxy, cyclopropyloxy, n-butyloxy, isobutyloxy, sec-butyloxy, tert-butyloxy, cyclobutyloxy, n-pentyloxy, cyclopentyloxy, n-hexyloxy, cyclohexyloxy, n-heptyloxy, n-octyloxy, n-nonyloxy, n-decyloxy, norbornyloxy, and adamantyloxy.

Suitable $C_1$-$C_{10}$ alkylthio groups include methylthio, ethylthio, n-propylthio, isopropylthio, cyclopropylthio, n-butylthio, isobutylthio, sec-butylthio, tert-butylthio, cyclobutylthio, n-pentylthio, cyclopentylthio, n-hexylthio, cyclohexylthio, n-heptylthio, n-octylthio, n-nonylthio, n-decylthio, norbornylthio, and adamantylthio.

Suitable $C_6$-$C_{20}$ aryloxy groups include phenyloxy, 2-methylphenyloxy, 3-methylphenyloxy, 4-methylphenyloxy, 2-ethylphenyloxy, 3-ethylphenyloxy, 4-ethylphenyloxy, 4-tert-butylphenyloxy, 4-butylphenyloxy, dimethylphenyloxy, naphthyloxy, biphenylyloxy, and terphenylyloxy.

Suitable $C_6$-$C_{20}$ arylthio groups include phenylthio, 2-methylphenylthio, 3-methylphenylthio, 4-methylphenylthio, 2-ethylphenylthio, 3-ethylphenylthio, 4-ethylphenylthio, 4-tert-butylphenylthio, 4-butylphenylthio, dimethylphenylthio, naphthylthio, biphenylylthio, and terphenylylthio.

Suitable substituted aryl groups include 2-methoxyphenyl, 3-methoxyphenyl, 4-methoxyphenyl, 2-ethoxyphenyl, 3-ethoxyphenyl, 4-ethoxyphenyl, 3-tert-butoxyphenyl, 4-tert-butoxyphenyl, biphenylyloxyphenyl, and biphenylylthiophenyl.

The monovalent aliphatic hydrocarbon groups preferably have 1 to 10 carbon atoms, more preferably 1 to 8 carbon atoms. The monovalent aromatic hydrocarbon groups preferably have 6 to 14 carbon atoms, more preferably 6 to 10 carbon atoms.

Of the foregoing groups, $R^1$ and $R^2$ are preferably selected from methyl, ethyl, n-propyl and phenyl, more preferably methyl and phenyl.

In formula (A1), n is an integer of 1 to 600, preferably 1 to 100, and more preferably 1 to 50.

The dual end alicyclic epoxy-modified silicone resin as component (A) may be used singly or in combination of two or more.

(B) Photoacid Generator

The photoacid generator as component (B) is not particularly limited as long as it is to decomposed to generate an acid upon light exposure, preferably it is decomposed to generate an acid upon exposure to light of wavelength 190 to 500 nm. The photoacid generator (B) serves as a curing catalyst. Suitable photoacid generators include onium salts, diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, iminosulfonate derivatives, and triazine derivatives.

Exemplary onium salts include sulfonium salts having the formula (B1) and iodonium salts having the formula (B2).

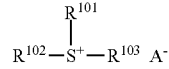

(B1)

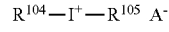

(B2)

In formulae (B1) and (B2), $R^{101}$ to $R^{105}$ are each independently an optionally substituted $C_1$-$C_{12}$ alkyl group, an optionally substituted $C_6$-$C_{12}$ aryl group, or an optionally substituted $C_7$-$C_{12}$ aralkyl group. $A^-$ is a non-nucleophilic counter ion.

The alkyl groups may be straight, branched or cyclic and include, for example, methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl and adamantyl. The aryl groups include phenyl, naphthyl and biphenylyl. The aralkyl groups include benzyl and phenethyl. Suitable substituents on these groups include oxo, straight, branched or cyclic $C_1$-$C_{12}$ alkoxy, straight, branched or cyclic $C_1$-$C_{12}$ alkyl, $C_6$-$C_{24}$ aryl, $C_7$-$C_{25}$ aralkyl, $C_6$-$C_{24}$ aryloxy, and $C_6$-$C_{24}$ arylthio groups.

Preferred examples of $R^{101}$ to $R^{105}$ include optionally substituted alkyl groups such as methyl, ethyl, propyl, butyl, cyclohexyl, norbornyl, adamantyl and 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyl, oxyphenyl, and biphenylylthiophenyl; and optionally substituted aralkyl groups such as benzyl and phenethyl. Of these, optionally substituted aryl groups and optionally substituted aralkyl groups are more preferred.

Examples of the non-nucleophilic counter ion represented by $A^-$ include halide ions such as chloride and bromide; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Exemplary diazomethane derivatives include compounds having the formula (B3).

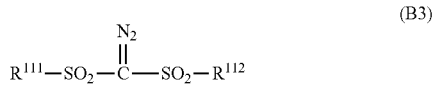

(B3)

In formula (B3), $R^{111}$ and $R^{112}$ are each independently a straight, branched or cyclic $C_1$-$C_{12}$ alkyl or haloalkyl group, an optionally substituted $C_6$-$C_{12}$ aryl group, or a $C_7$-$C_{12}$ aralkyl group.

Examples of the alkyl group are as exemplified above for $R^{101}$ to $R^{105}$. Examples of the haloalkyl group include trifluoromethyl, 1,1,1-trifluoroethyl, 1,1,1-trichloroethyl, and nonafluorobutyl. Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Examples of the aralkyl group include benzyl and phenethyl.

Exemplary glyoxime derivatives include compounds having the formula (B4).

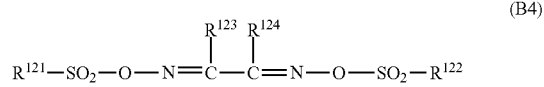

(B4)

In formula (B4), $R^{121}$ to $R^{124}$ are each independently a $C_1$-$C_2$ alkyl or haloalkyl group, an optionally substituted $C_6$-$C_{12}$ aryl group, or a $C_7$-$C_{12}$ aralkyl group. $R^{123}$ and $R^{124}$ may bond together to form a ring with the carbon atoms to which they are attached. In the case of ring formation, $R^{123}$ bonds with $R^{124}$ to form a $C_1$-$C_{12}$ straight or branched alkylene group.

Examples of the alkyl, haloalkyl, optionally substituted aryl and aralkyl groups are as exemplified above for $R^{111}$ and $R^{112}$. Examples of the straight or branched alkylene group include methylene, ethylene, propylene, butylene, and hexylene.

Examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl) sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl) sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl (2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexyiphenylsulfonium p-toluenesulfonate, bis(4-tert-butylphenyl)iodonium hexafluorophosphate, diphenyl (4-thiophenoxyphenyl)sulfonium hexafluoroantimonate, [4-(4-biphenylylthio)phenyl]-4-biphenylylphenylsulfonium tris(trifluoromethanesulfonyl)-methide, triphenylsulfonium tetrakis(fluorophenyl)borate, tris[4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis (pentafluorophenyl)borate.

Examples of the diazomethane derivatives include bis (benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-pentylsulfonyl)diazomethane, bis (isopentylsulfonyl)diazomethane, bis(sec-pentylsulfonyl) diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n- butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone and dicyclohexyl disulfone.

Examples of the nitrobenzyl sulfonate derivatives include 2,6-dinitrobenzyl p-toluenesulfonate and 2,4-dinitrobenzyl p-toluenesulfonate.

Examples of the sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Examples of the imido-yl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Typical of the oxime sulfonate derivative is α-(benzenesulfoniumoxyimino)-4-methylphenylacetonitrile.

Examples of the iminosulfonate derivatives include (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile, as well as 2-methyl-2-[(4-methylphenyl)sulfonyl]-1-[(4-methylthio)phenyl]-1-propane.

As the PAG, the onium salts are preferred, with the sulfonium salts being more preferred.

Preferably the PAG (B) is used in an amount of 0.05 to 20 parts by weight, more preferably 0.2 to 5 parts by weight per 100 parts by weight of components (A) and (B) combined. An amount of PAG in the range ensures sufficient photocurability and is effective for preventing the cure behavior of a thick film from being degraded by the photo-absorption of the PAG itself. To acquire transparency and light resistance characteristic of the invention, the amount of photo-absorptive PAG (B) is as small as possible within the range that insures photo-curability. The PAG may be used alone or in admixture.

(C) Epoxy-Containing Silicone Resin

Component (C) is an epoxy-containing silicone resin, preferably comprising repeating units having the formulae (C1) to (C6), which are simply referred to as repeating units (C1) to (C6).

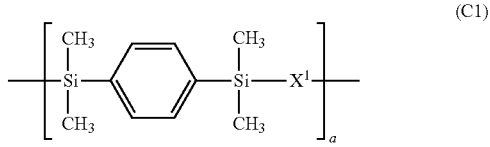
(C1)

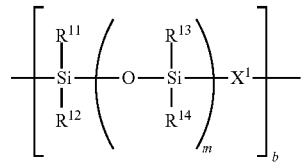
(C2)

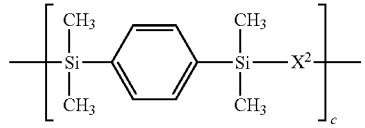
(C3)

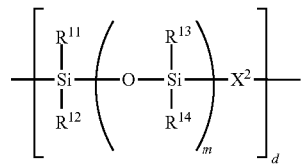
(C4)

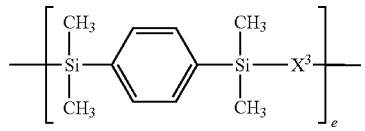
(C5)

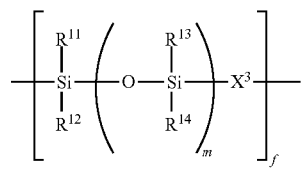
(C6)

In formulae (C2), (C4) and (C6), $R^{11}$ to $R^{14}$ are each independently a $C_1$-$C_{20}$ monovalent hydrocarbon group which may contain a heteroatom, and m is each independently an integer of 1 to 600. When m is an integer of at least 2, groups $R^{13}$ may be identical or different and groups $R^{14}$ may be identical or different. In the repeating units (C2), (C4) and (C6), where at least two siloxane units are included, the siloxane units may be all identical, or at least two different siloxane units may be included. Where at least two different siloxane units are included (i.e., m is an integer of at least 2), the siloxane units may be bonded randomly or alternately, or a plurality of blocks each consisting of identical siloxane units may be included.

The monovalent hydrocarbon group which may contain a heteroatom may be straight, branched or cyclic, and examples thereof are as exemplified above for $R^1$ to $R^4$. Among others, $R^1$ to $R^4$ are preferably selected from methyl, ethyl, n-propyl and phenyl, more preferably methyl and phenyl.

In formulae (C2), (C4) and (C6), m is each independently an integer of 1 to 600, preferably 1 to 300, more preferably 1 to 100.

In formulae (C1) to (C6), a, b, c, d, e and f are positive numbers in the range: $0 \leq a \leq 1$, $0 \leq b \leq 1$, $0 \leq c \leq 1$, $0 \leq d \leq 1$, $0 \leq e \leq 1$, $0 \leq f \leq 1$, $0 \leq c+d+e+f \leq 1$, and $a+b+c+d+e+f=1$; preferably $0.2 \leq a+c+e \leq 0.95$, $0.05 \leq b+d+f \leq 0.8$, $0 \leq a+b \leq 0.9$, $0 \leq c+d \leq 0.7$, and $0 < e+f \leq 1$; more preferably $0.3 \leq a+c+e \leq 0.9$, $0.1 \leq b+d+f \leq 0.7$, $0 \leq a+b \leq 0.6$, $0 \leq c+d \leq 0.4$, and $0.4 \leq e+f \leq 1$.

In formulae (C1) and (C2), $X^1$ is a divalent group having the formula (X1).

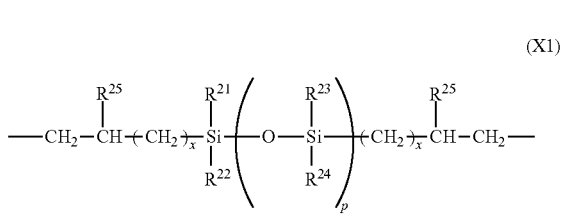
(X1)

In formula (X1), $R^{21}$ to $R^{24}$ are each independently a $C_1$-$C_{20}$ monovalent hydrocarbon group which may contain a heteroatom, and p is an integer of 1 to 600. When p is an integer of at least 2, groups $R^{23}$ may be identical or different and groups $R^{24}$ may be identical or different. $R^{25}$ is each independently hydrogen or methyl, and x is each independently an integer of 0 to 7. In the group of formula (X1), where at least two siloxane units are included, the siloxane units may be all identical, or at least two different siloxane units may be included. Where at least two different siloxane units are included (i.e., p is an integer of at least 2), the siloxane units may be bonded randomly or alternately, or a plurality of blocks each consisting of identical siloxane units may be included.

The monovalent hydrocarbon group which may contain a heteroatom may be straight, branched or cyclic and examples thereof are as exemplified above for $R^{11}$ to $R^{14}$. Among others, $R^{21}$ to $R^{24}$ are preferably selected from methyl, ethyl, n-propyl, and phenyl, more preferably methyl and phenyl.

In formulae (C3) and (C4), $X^2$ is a divalent group having the formula (X2).

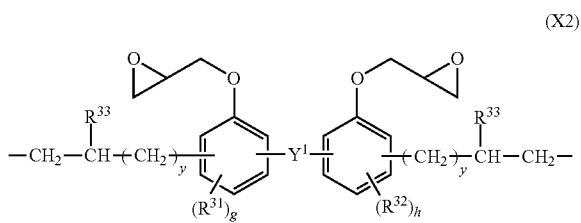
(X2)

In formula (X2), $Y^1$ is a single bond, methylene, propane-2,2-diyl, 1,1,1,3,3,3-hexafluoropropane-2,2-diyl, or fluorene-9,9-diyl. $R^{31}$ and $R^{32}$ are each independently a $C_1$-$C_4$ alkyl or alkoxy group, g and h are each independently 0, 1 or 2. When g is 2, groups $R^{31}$ may be identical or different. When h is 2, groups $R^{32}$ may be identical or different $R^{33}$ is each independently hydrogen or methyl, y is each independently an integer of 0 to 7.

In formulae (C5) and (C6), $X^3$ is a divalent group having the formula (X3).

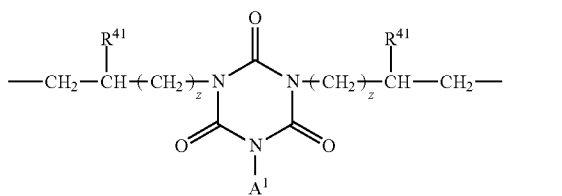
(X3)

$R^{41}$ is each independently hydrogen or methyl, and z is each independently an integer of 0 to 7. $A^1$ is a monovalent group having the formula (X3-1) or (X3-2).

(X3-1)

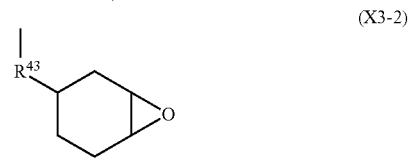
(X3-2)

Herein, $R^{42}$ and $R^{43}$ are each independently a $C_1$-$C_8$ divalent hydrocarbon group in which an ester bond or ether bond may intervene between carbon atoms. The divalent hydrocarbon group may be straight, branched or cyclic and includes, for example, $C_1$-$C_8$ alkanediyl groups such as methylene, ethylene, propane-1,2-diyl, propane-1,3-diyl, butane-1,2-diyl, butane-1,3-diyl, and butane-1,4-diyl. Among others, $R^{42}$ and $R^{43}$ are preferably methylene or ethylene, with methylene being more preferred.

The repeating units (C1) to (C6) may be bonded randomly or blockwise. The epoxy-containing silicone resin preferably has a silicone (siloxane unit) content of 30 to 80% by weight.

The epoxy-containing silicone resin preferably has a weight average molecular weight (Mw) of 3,000 to 500,000, more preferably 5,000 to 200,000. Throughout the disclosure, Mw is measured versus polystyrene standards by gel permeation chromatography (GPC) using tetrahydrofuran as eluent.

The epoxy-containing silicone resin (C) may be prepared, for example, by mixing necessary amounts of a vinyl-containing compound and a hydrosilyl-containing organosilicon compound (corresponding to the relevant portions in the silicone resin) and conducting hydrosilylation reaction in a standard way.

The addition of component (C) makes it easy to adjust the viscosity of the resin composition, and hence, to form a coating or film of a necessary thickness and to make the film more flexible.

Component (C) is preferably used in an amount of 0 to 10,000 parts, more preferably 0 to 5,000 parts, even more preferably 10 to 2,000 parts by weight per 100 parts by weight of component (A). An amount of component (C) in the range ensures that the composition is easy to handle and effectively moldable. The epoxy-containing silicone resin may be used alone or in admixture.

(D) Solvent

To the photosensitive resin composition, (D) a solvent may be added in order to facilitate the coating operation. The solvent (D) used herein is not particularly limited as long as components (A) to (C) and component (E) and other additives (to be described later) are soluble therein.

Preferred solvents are organic solvents. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more.

Of these solvents, preferred are ethyl lactate, cyclohexanone, cyclopentanone, PGMEA, γ-butyrolactone, and mixtures thereof, in which the PAG is most soluble.

It is preferred from the standpoints of compatibility and viscosity of the resin composition that the solvent (D) be used in an amount of 50 to 2,000 parts, more preferably 50 to 1,000 parts, and especially 50 to 100 parts by weight per 100 parts by weight of components (A) and (B) combined.

(E) Antioxidant

The photosensitive resin composition may further contain (E) an antioxidant as an additive which is effective for improving heat resistance. The antioxidant is preferably selected from hindered phenol compounds and hindered amine compounds.

Although the hindered phenol compounds used herein are not particularly limited, the hindered phenol compounds listed below are preferred. 1,3,5-trimethyl-2,4,6-tris(3,5-di-t-butyl-4-hydroxybenzyl)benzene (trade name: IRGANOX 1330), 2,6-di-t-butyl-4-methylphenol (trade name: Sumilizer BHT), 2,5-di-t-butylhydroquinone (trade name: Nocrac NS-7), 2,6-di-t-butyl-4-ethylphenol (trade name: Nocrac M-17), 2,5-di-t-pentylhydroquinone (trade name: Nocrac DAH), 2,2'-methylenebis(4-methyl-6-t-butylphenol) (trade name: Nocrac NS-6), 3,5-di-t-butyl-4-hydroxybenzyl phosphonate diethyl ester (trade name: IRGANOX 1222), 4,4'-thiobis(3-methyl-6-t-butylphenol) (trade name: Nocrac 300), 2,2'-methylenebis(4-ethyl-6-t-butylphenol) (trade name: Nocrac NS-5), 4,4'-butylidenebis(3-methyl-6-t-butylphenol) (trade name: Adeka Stab AO-40), 2-t-butyl-6-(3-t-butyl-2-hydroxy-5-methylbenzyl)-4-methylphenyl acrylate (trade name: Sumilizer GM), 2-[1-(2-hydroxy-3,5-di-t-pentylphenyl)ethyl]-4,6-di-t-pentylphenyl acrylate (trade name: Sumilizer GS), 2,2'-methylenebis[4-methyl-6-(α-methylcyclohexyl)phenol], 4,4'-methylenebis(2,6-di-t-butylphenol) (trade name: Seenox 226M), 4,6-bis(octylthiomethyl)-o-cresol (trade name: IRGANOX 1520L), 2,2'-ethylenebis(4,6-di-t-butylphenol), octadecyl 3-(3,5-di-t-butyl-4-hydroxyphenyl)propionate (trade name: IRGANOX 1076), 1,1,3-tris(2-methyl-4-hydroxy-5-t-butylphenyl)butane (trade name: Adeka Stab AO-30), tetrakis[methylene-(3,5-di-t-butyl-4-hydroxyhydrocinnamate)]methane (trade name: Adeka Stab AO-60), triethylene glycol bis[3-(3-t-butyl-5-methyl-4-hydroxyphenyl)propionate] (trade name: IRGANOX 245), 2,4-bis(n-octylthio)-6-(4-hydroxy-3,5-di-t-butylanilino)-1,3,5-triazine (trade name: IRGANOX 565), N,N'-hexamethylenebis(3,5-di-t-butyl-4-hydroxyhydrocinnamide) (trade name: IRGANOX 1098), 1,6-hexanediol-bis[3-(3,5-di-t-butyl-4-hydroxyphenyl)propionate] (trade name: IRGANOX 259), 2,2-thio-diethylenebis[3-(3,5-di-t-butyl-4-hydroxyphenyl)propionate] (trade name: IRGANOX 1035), 3,9-bis[2-[3-(3-t-butyl-4-hydroxy-5-methylphenyl)propionyloxy]-1,1-dimethylethyl]2,4,8,10-tetraoxaspiro[5.5]undecane (trade name: Sumilizer GA-80), tris(3,5-di-t-butyl-4-hydroxybenzyl) isocyanurate (trade name: IRGANOX 3114), bis(ethyl 3,5-di-t-butyl-4-hydroxybenzylphosphonate) calcium/polyethylene wax 50/50 mixture (trade name: IRGANOX 1425WL), isooctyl 3-(3, 5-di-t-butyl-4-hydroxyphenyl)propionate (trade name: IRGANOX 1135), 4,4'-thiobis(6-t-butyl-3-methylphenol) (trade name: Sumilizer WX-R), 6-[3-(3-t-butyl-4-hydroxy-5-methylphenyl)propoxy]-2,4,8,10-tetra-t-butyldibenzo-[d, f][1,3,2]dioxaphosphepin (trade name: Sumilizer GP), etc.

Although the hindered amine compounds used herein are not particularly limited, the hindered amine compounds listed below are preferred. p,p'-dioctyldiphenylamine (trade name: IRGANOX 5057), phenyl-α-naphthylamine (trade name: Nocrac PA), poly(2,2,4-trimethyl-1,2-dihydroquinoline) (trade name: Nocrac 224, 224-S), 6-ethoxy-2,2,4-trimethyl-1,2-dihydroquinoline (trade name: Nocrac AW), N,N'-diphenyl-p-phenylenediamine (trade name: Nocrac DP), N,N'-di-β-naphthyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'-(α,α-dimethylbenzyl) diphenylamine (trade name: Nocrac CD), p,p-toluenesulfonylaminodiphenylamine (trade name: Nocrac TD), N-phenyl-N'-(3-methacryloxy-2-hydroxypropyl)-p-phenylenediamine (trade name: Nocrac G1), N-(1-methylheptyl)-N'-phenyl-p-phenylenediamine (trade name: Ozonon 35), N,N'-di-sec-butyl-p-phenylenediamine (trade name: Sumilizer BPA), N-phenyl-N'-1,3-dimethylbutyl-p-phenylenediamine (trade name: Antigene 6C), alkylated diphenylamine (trade name: Sumilizer 9A), dimethyl-1-(2-hydroxyethyl)-4-hydroxy-2,2,6,6-tetramethylpiperidine succinate polycondensate (trade name: Tinuvin 622LD), poly[[6-(1,1,3,3-tetramethylbutyl)amino]-1,3,5-triazine-2, 4-diyl][(2,2,6,6-tetramethyl-4-piperidyl)imino]hexamethylene[(2,2,6,6-tetramethyl-4-piperidyl)imino]] (trade name: CHIMASSORB 944), N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl)sebacate (trade name: Tinuvin 123), bis(2,2,6,6-tetramethyl-4-piperidyl)sebacate (trade name: Tinuvin 770), bis(1,2,2,6,6-pentamethyl-4-piperidyl) 2-(3,5-di-t-butyl-4-hydroxybenzyl)-2-n-butylmalonate (trade name: Tinuvin 144), bis(1,2,2,6,6-pentamethyl-4-piperidyl) sebacate (trade name: Tinuvin 765), tetrakis(1,2,2,6,6-pentamethyl-4-piperidyl) 1,2,3,4-butanetetracarboxylate (trade name: LA-57), tetrakis(2,2,6,6-tetramethyl-4-piperidyl) 1,2, 3,4-butanetetracarboxylate (trade name: LA-52), an esterified mixture of 1,2,3,4-butanetetracarboxylic acid with 1,2, 2,6,6-pentamethyl-4-piperidinol and 1-tridecanol (trade name: LA-62), an esterified mixture of 1,2,3,4-butanetetracarboxylic acid with 2,2,6,6-tetramethyl-4-piperidinol and 1-tridecanol (trade name: LA-67), an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), an esterified mixture of 1,2,3,4-butanetetracarboxylic acid with 2,2,6,6-tetramethyl-4-piperidinol and 3,9-bis (2-hydroxy-1,1-dimethylethyl)-2,4,8,10-tetraoxaspiro[5.5] undecane (trade name: LA-68LD), (2,2,6,6-tetramethylene-4-piperidyl)-2-propylene carboxylate (trade name: Adeka Stab LA-82), (1,2,2,6,6-pentamethyl-4-piperidyl)-2-propylene carboxylate (trade name: Adeka Stab LA-87), etc.

The amount of component (E) used is not particularly limited as long as the benefits of the invention are not impaired. When used, the amount of component (E) is preferably 0.01 to 1% by weight of the resin composition. The antioxidants may be used alone or in admixture.

Other Additives

Besides the aforementioned components, the photosensitive resin composition may contain optional additives, for example, surfactants which are commonly used for improving coating properties and silane coupling agents.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. The amount of surfactant is not particularly limited as long as the benefits of the invention are not impaired. When used, the amount of the surfactant is preferably 0.01 to 1% by weight of the resin composition.

Inclusion of a silane coupling agent is effective for enhancing the adhesion of the resin composition to adherends. Suitable silane coupling agents include epoxy silane coupling agents and aromatic aminosilane coupling agents. The silane coupling agent may be used alone or in admixture. The amount of the silane coupling agent used is not particularly limited as long as the benefits of the invention are not impaired. When used, the amount of the silane coupling agent is preferably 0.01 to 5% by weight of the resin composition.

The photosensitive resin composition of the invention is prepared in any desired way. For example, it may be prepared by agitating and mixing the aforementioned components and optionally passing the mixture through a filter to remove any solids.

Pattern Forming Process

Another embodiment of the invention is a pattern forming process using the photosensitive resin composition defined above, the process comprising the steps of:
 (i) coating the photosensitive resin composition onto a substrate to form a photosensitive film thereon,
 (ii) exposing the photosensitive film to radiation through a photomask, and
 (iii) developing the exposed film in a developer.

In step (i), the photosensitive resin composition is coated onto a substrate to form a photosensitive resin coating thereon. Examples of the substrate include silicon wafers, glass wafers, quartz wafers, plastic circuit substrates, and ceramic circuit substrates.

The coating technique may be dipping, spin coating, roll coating or the like. The coating weight may be selected as appropriate for a particular purpose, preferably so as to form a resin film having a thickness of 0.1 to 100 μm.

At this point, the coating may be prebaked to evaporate off the solvent and the like, if necessary, for efficient photo-cure reaction. Prebake may be performed, for example, at 40 to 160° C. for 1 minute to about 1 hour.

Next, in step (ii), the photosensitive resin film is exposed to radiation through a photomask. The exposure radiation is preferably of wavelength 240 to 500 nm. Examples of the radiation of wavelength 240 to 500 nm include radiation of various wavelengths from radiation-emitting units, specifically UV radiation such as g-line or i-line and deep UV (248 nm). An appropriate exposure dose is 10 to 5,000 mJ/cm².

The photomask used herein may be, for example, one perforated with a desired pattern. Although the material of the photomask is not particularly limited, a material capable of shielding radiation of wavelength 240 to 500 nm, typically chromium is preferred.

The next step may be post-exposure bake (PEB) which is effective for enhancing to development sensitivity. PEB is performed, for example, at 40 to 160° C. for 5 to 30 minutes.

Step (iii) is to develop the resin film after the exposure or PEB in a developer. The preferred developers are organic solvents, as used in the photosensitive resin composition, for example, isopropyl alcohol (IPA), propylene glycol monomethyl ether (PGME), and propylene glycol monomethyl ether acetate (PGMEA). By development in organic solvent-based developers, the unexposed region of the resin film is dissolved away, yielding a negative pattern. Development is effected in a conventional manner, for example, by dipping the exposed film in the developer. The development is followed by washing, rinsing and drying if necessary. In this way, a resin film having the desired pattern is obtained. Although the pattern forming process has been described, it is sometimes unnecessary to form a pattern. When it is simply desired to form a uniform film, for example, the same process as above may be followed except that in step (ii), the resin film is exposed to radiation of suitable wavelength directly, i.e., without the photomask.

If necessary, the patterned film may be post-cured in an oven or hot plate at a temperature of preferably 120 to 300° C. for 10 minutes to 10 hours for increasing the crosslinking density of the resin film and removing any residual volatile matter.

Opto-Semiconductor Device

An opto-semiconductor device may be produced by using the photosensitive resin composition, and processing it to form a fine size pattern according to the aforementioned process. Since a film of the photosensitive resin composition has excellent transparency, light resistance and heat resistance, an opto-semiconductor device having the film is advantageously used as optical devices including light-emitting devices such as LED, light-receiving devices such as photodiodes, optical sensors, and CMOS image sensors, and optical transmission devices such as optical waveguides. Preferably the film has a transmittance of at least 92.0%, more preferably at least 96.0/0%, even more preferably at least 98.0/0%, with respect to light of wavelength 405 nm.

EXAMPLE

Examples of the invention are given below by way of illustration and not by way of limitation. Notably, the weight average molecular weight (Mw) is measured versus monodisperse polystyrene standards by GPC under conditions including column TSKgel Super HZM-H (Tosoh Corp.), flow rate 0.6 mL/min, eluent THF, and column temperature 40° C. All parts are by weight (pbw).

Compounds (S-1) to (S-5) used in Examples and Comparative Examples are identified below.

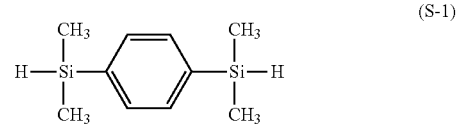

(S-1)

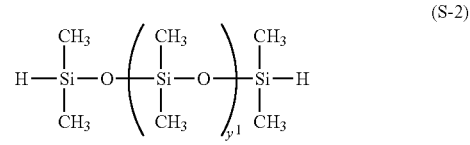

(S-2)

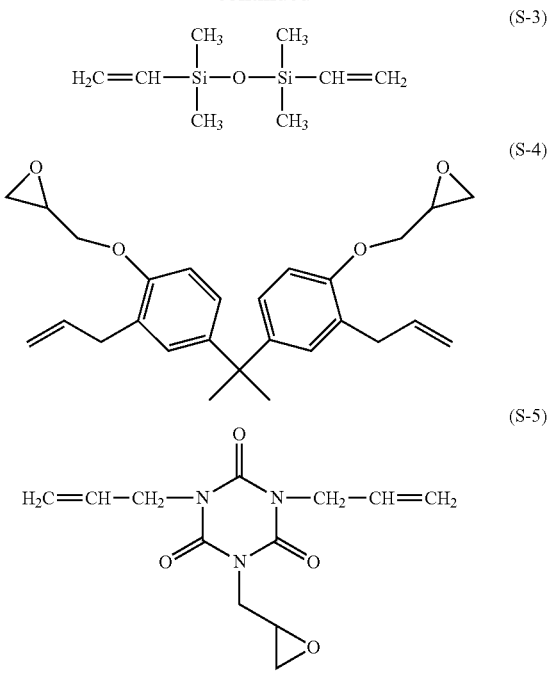

(S-3)

(S-4)

(S-5)

[1] Synthesis of Epoxy-Containing Silicone Resin

Synthesis Example 1

Synthesis of Resin C-1

A 3-L flask equipped with a stirrer, thermometer, nitrogen purge line, and reflux condenser was charged with 265.0 g (1.00 mol) of Compound (S-5), then with 2,000 g of toluene, and heated at 70° C. Thereafter, 1.0 g of a chloroplatinic acid toluene solution (Pt concentration 0.5 wt %) was added, and 164.9 g (0.85 mol) of Compound (S-1) and 453.0 g (0.15 mol) of Compound (S-2) ($y^1$=40, by Shin-Etsu Chemical Co., Ltd.) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Resin C-1. Resin C-1 was analyzed for structure by $^1$H-NMR and $^{29}$Si-NMR spectroscopy (Bruker Corp.) and GPC. Resin C-1 had a Mw of 65,000 and a silicone content of 51.3 wt %.

Synthesis Example 2

Synthesis of Resin C-2

A 3-L flask equipped with a stirrer, thermometer, nitrogen purge line, and reflux condenser was charged with 111.6 g (0.60 mol) of Compound (S-3) and 156.8 g (0.40 mol) of Compound (S-4), then with 2,000 g of toluene, and heated at 70° C. Thereafter, 1.0 g of a chloroplatinic acid toluene solution (Pt concentration 0.5 wt %) was added, and 135.8 g (0.70 mol) of Compound (S-1) and 906.0 g (0.30 mol) of Compound (S-2) ($y^1$=40, by Shin-Etsu Chemical Co., Ltd.) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Resin C-2. Resin C-2 was analyzed for structure by $^1$H-NMR and $^{29}$Si-NMR spectroscopy (Bruker Corp.) and GPC. Resin C-2 had a Mw of 55,000 and a silicone content of 77.7 wt %.

Synthesis Example 3

Synthesis of Resin C-3

A 3-L flask equipped with a stirrer, thermometer, nitrogen purge line, and reflux condenser was charged with 111.6 g (0.60 mol) of Compound (S-3) and 106.0 g (0.40 mol) of Compound (S-5), then with 2,000 g of toluene, and heated at 70° C. Thereafter, 1.0 g of a chloroplatinic acid toluene solution (Pt concentration 0.5 wt %) was added, and 174.6 g (0.90 mol) of Compound (S-1) and 302.0 g (0.10 mol) of Compound (S-2) ($y^1$=40, by Shin-Etsu Chemical Co., Ltd.) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Resin C-3. Resin C-3 was analyzed for structure by $^1$H-NMR and $^{29}$Si-NMR spectroscopy (Bruker Corp.) and GPC. Resin C-3 had a Mw of 50,000 and a silicone content of 59.6 wt %.

Synthesis Example 4

Synthesis of Resin C-4

A 3-L flask equipped with a stirrer, thermometer, nitrogen purge line, and reflux condenser was charged with 392.0 g (1.00 mol) of Compound (S-4), then with 2,000 g of toluene, and heated at 70° C. Thereafter, 1.0 g of a chloroplatinic acid toluene solution (Pt concentration 0.5 wt %) was added, and 155.2 g (0.80 mol) of Compound (S-1) and 317.0 g (0.20 mol) of Compound (S-2) ($y^1$=20, by Shin-Etsu Chemical Co., Ltd.) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Resin C-4. Resin C-4 was analyzed for structure by $^1$H-NMR and $^{29}$Si-NMR spectroscopy (Bruker Corp.) and GPC. Resin C-4 had a Mw of 23,000 and a silicone content of 36.7 wt %.

Synthesis Example 5

Synthesis of Resin C-5

A 3-L flask equipped with a stirrer, thermometer, nitrogen purge line, and reflux condenser was charged with 274.4 g (0.70 mol) of Compound (S-4) and 79.5 g (0.30 mol) of Compound (S-5), then with 2,000 g of toluene, and heated at 70° C. Thereafter, 1.0 g of a chloroplatinic acid toluene solution (Pt concentration 0.5 wt %) was added, and 58.2 g (0.30 mol) of Compound (S-1) and 1,109.5 g (0.70 mol) of Compound (S-2) ($y^1$=20, by Shin-Etsu Chemical Co., Ltd.) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Resin C-5. Resin C-5 was analyzed for structure by $^1$H-NMR and $^{29}$Si-NMR spectroscopy (Bruker Corp.) and GPC. Resin C-5 had a Mw of 42,000 and a silicone content of 72.9 wt %.

Synthesis Example 6

Synthesis of Resin C-6

A 3-L flask equipped with a stirrer, thermometer, nitrogen purge line, and reflux condenser was charged with 55.8 g (0.30 mol) of Compound (S-3), 117.6 g (0.30 mol) of Compound (S-4), and 106.0 g (0.40 mol) of Compound (S-5), then with 2,000 g of toluene, and heated at 70° C. Thereafter, 1.0 g of a chloroplatinic acid toluene solution (Pt concentration 0.5 wt %) was added, and 135.8 g (0.70 mol) of Compound (S-1) and 475.5 g (0.30 mol) of Compound (S-2) ($y^1$=20, by Shin-Etsu Chemical Co., Ltd.) were added dropwise over 1 hour (total hydrosilyl groups/total alkenyl groups=1/1 in molar ratio). After the completion of dropwise addition, the solution was heated at 100° C. and aged for 6 hours. From the reaction solution, the toluene was distilled off in vacuum, yielding Resin C-6. Resin C-6 was analyzed for structure by $^1$H-NMR and $^{29}$Si-NMR spectroscopy (Bruker Corp.) and GPC. Resin C-6 had a Mw of 31,000 and a silicone content of 59.6 wt %.

[2] Preparation and Evaluation of Photosensitive Resin Compositions

Examples 1 to 14 and Comparative Examples 1 to 9

Photosensitive resin compositions were prepared by combining Compounds A-1 to A-4 or A'-1 to A'-3 as component (A), photoacid generator B-1 as component (B), Resins C-1 to C-6 as epoxy-containing silicone resin (C), cyclopentanone as solvent (D), and antioxidant E-1 or E-2 as component (E) in accordance with the formulation shown in Table 1, agitating them until dissolution, and precision filtering through a Teflon® filter with a pore size of 0.2 μm.

TABLE 1

| | Component (pbw) | Photosensitive resin composition | | | | | | | | | | | |
|---|---|---|---|---|---|---|---|---|---|---|---|---|---|
| | | Example | | | | | | | | | | | |
| | | 1 | 2 | 3 | 4 | 5 | 6 | 7 | 8 | 9 | 10 | 11 | 12 |
| (A) | A-1 | 100 | | | | 5 | 5 | | | | | 5 | 900 |
| | A-2 | | 100 | | | | | 5 | 5 | | | | |
| | A-3 | | | 100 | | | | | | 5 | | | |
| | A-4 | | | | 100 | | | | | | 5 | | |
| | A'-1 | | | | | | | | | | | | |
| | A'-2 | | | | | | | | | | | | |
| | A'-3 | | | | | | | | | | | | |
| (B) | B-1 | 2 | 2 | 2 | 2 | 2 | 2 | 2 | 2 | 2 | 2 | 0.5 | 2 |
| (C) | C-1 | | | | | 100 | | | | | | | |
| | C-2 | | | | | | 100 | | | | | | |
| | C-3 | | | | | | | 100 | | | | 100 | 100 |
| | C-4 | | | | | | | | 100 | | | | |
| | C-5 | | | | | | | | | 100 | | | |
| | C-6 | | | | | | | | | | 100 | | |
| (D) | cyclo-pentanone | 100 | 100 | 100 | 100 | 100 | 100 | 100 | 100 | 100 | 100 | 100 | 100 |
| (E) | E-1 | | | | | | | | | | | | |
| | E-2 | | | | | | | | | | | | |

| | Component (pbw) | Example | | Comparative Example | | | | | | | | |
|---|---|---|---|---|---|---|---|---|---|---|---|---|
| | | 13 | 14 | 1 | 2 | 3 | 4 | 5 | 6 | 7 | 8 | 9 |
| (A) | A-1 | 5 | | | | | | | | | | |
| | A-2 | | | | | | | | | | | |
| | A-3 | | | | | | | | | | | |
| | A-4 | | 400 | | | | | | | | | |
| | A'-1 | | | 100 | | 5 | | 5 | | | | |
| | A'-2 | | | | 100 | | 5 | | 5 | | | |
| | A'-3 | | | | | | | | | 100 | 5 | 5 |
| (B) | B-1 | 2 | 2 | 2 | 2 | 2 | 2 | 2 | 2 | 2 | 2 | 2 |
| (C) | C-1 | | | | | | | | | | | |
| | C-2 | | | | | | | | | | | |
| | C-3 | 100 | | | | 100 | | 100 | | | 100 | 100 |
| | C-4 | | | | | | | | | | | |
| | C-5 | | | | | | | | | | | |
| | C-6 | | 100 | | | | 100 | | 100 | | | |
| (D) | cyclo-pentanone | 100 | 100 | 100 | 100 | 100 | 100 | 100 | 100 | 100 | 100 | 100 |
| (E) | E-1 | 0.1 | 0.1 | | | | 0.1 | 0.1 | | | | 0.1 |
| | E-2 | 0.1 | 0.1 | | | | 0.1 | 0.1 | | | | 0.1 |

Compounds A-1 to A-4, Compounds A'-1 to A'-3, acid generator B-1, antioxidants E-1 and E-2 are identified below. Compounds A-1, A-2, A-3, A-4 (Shin-Etsu Chemical Co., Ltd.)
Compound A'-1 (Shin-Etsu Chemical Co., Ltd.), Compound A'-2 (Shikoku Chemicals Corp.), Compound A'-3 (Shin-Etsu Chemical Co., Ltd.)
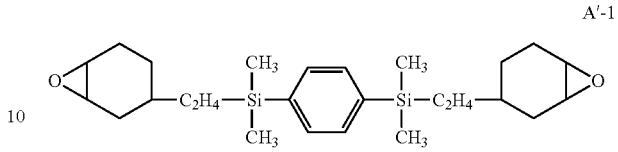
A'-1
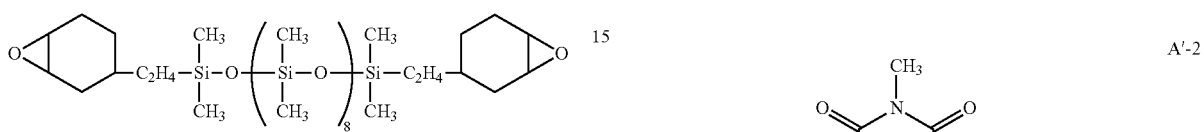
A-1
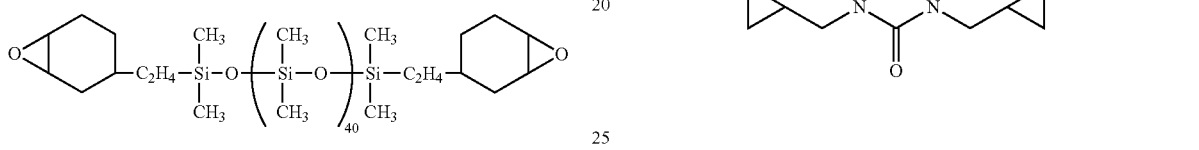
A-2
A'-2
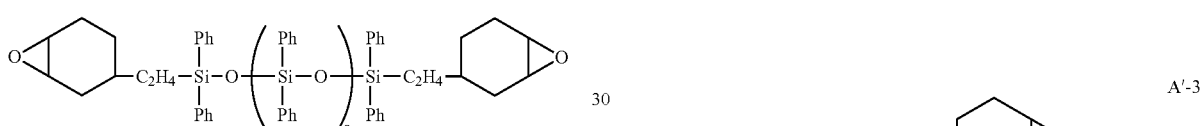
A-3
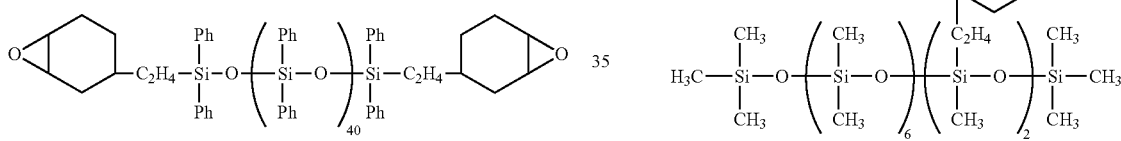
A-4
A'-3
Herein Ph stands for phenyl.
Photoacid Generator B-1
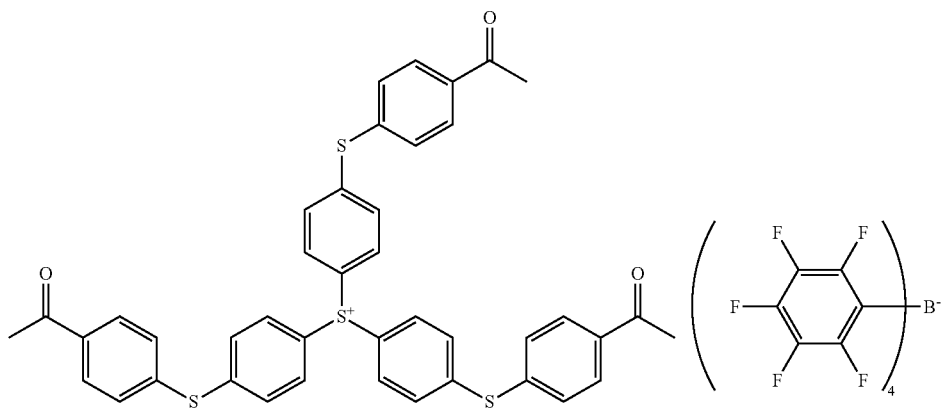

Antioxidant E-1: Chimassorb 119FL (BASF)

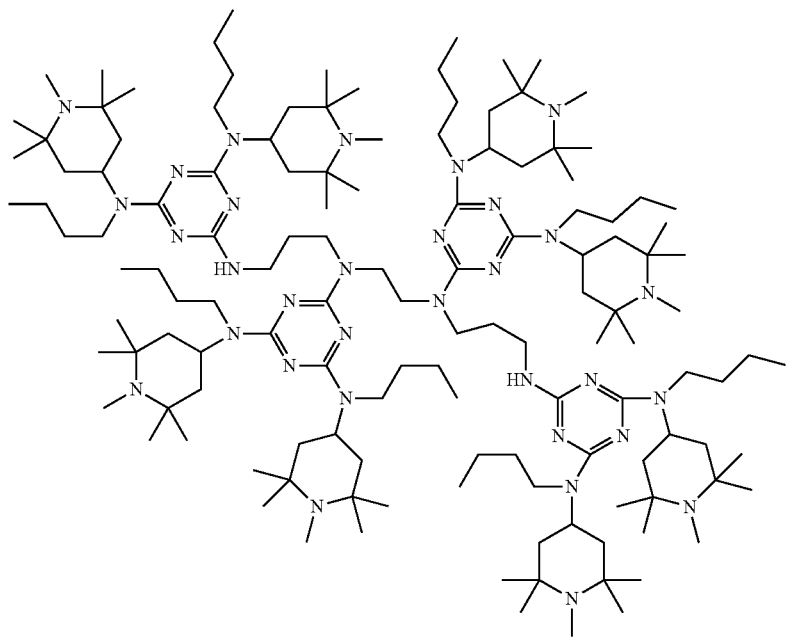 [SMILES: CCCCN(c1nc(NCCCN(CCN(CCCNc2nc(N(CCCC)C3CC(C)(C)N(C)C(C)(C)C3)nc(N(CCCC)C3CC(C)(C)N(C)C(C)(C)C3)n2)c2nc(N(CCCC)C3CC(C)(C)N(C)C(C)(C)C3)nc(N(CCCC)C3CC(C)(C)N(C)C(C)(C)C3)n2)c2nc(N(CCCC)C3CC(C)(C)N(C)C(C)(C)C3)nc(N(CCCC)C3CC(C)(C)N(C)C(C)(C)C3)n2)nc(N(CCCC)C2CC(C)(C)N(C)C(C)(C)C2)n1)C1CC(C)(C)N(C)C(C)(C)C1]

Antioxidant E-2: Irganox 3114 (BASF)

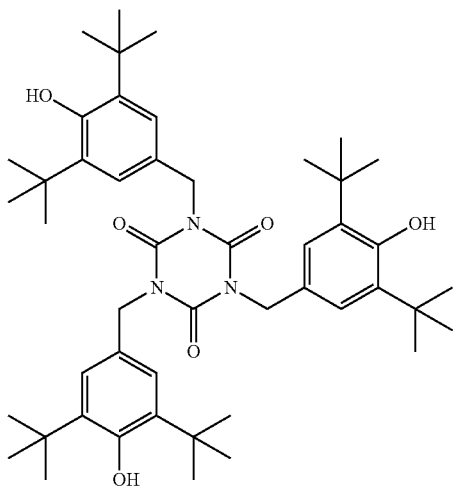 [SMILES: CC(C)(C)c1cc(Cn2c(=O)n(Cc3cc(C(C)(C)C)c(O)c(C(C)(C)C)c3)c(=O)n(Cc3cc(C(C)(C)C)c(O)c(C(C)(C)C)c3)c2=O)cc(C(C)(C)C)c1O]

[Evaluation of Pattern Formation]

Using a spin coater, each photosensitive resin composition was coated onto a 8-inch silicon wafer, which had been primed with hexamethyldisilazane (HMDS), to form a film having the thickness shown in Table 2. The coated silicon wafer was placed on a hotplate and heat dried at 100° C. for 5 minutes in order to remove the solvent from the composition.

The composition (film) applied to the silicon wafer was exposed to light of wavelength 365 nm in the exposure dose shown in Table 2, through a quartz mask having groups of lines and spaces of equal width with the line width varying from 1 μm to 50 μm. The exposure was performed using a stepper exposure apparatus NSR-1755i7A (Nikon Corp.). The coated wafer was post-exposure baked (PEB) at 140° C. for 5 minutes and then cooled.

Subsequently, the coated wafer or substrate was developed by dipping in propylene glycol monomethyl ether acetate (PGMEA) for 3 minutes. The line width resolved during development is reported in Table 2. The film thickness after development is also reported in Table 2.

TABLE 2

| | | Film thickness after spin coating (μm) | Film thickness after development (μm) | Exposure dose (mJ/cm$^2$) | Resolution (μm) |
|---|---|---|---|---|---|
| Example | 1 | 20.2 | 20.1 | 2,000 | 30 |
| | 2 | 20.1 | 20.0 | 2,000 | 30 |
| | 3 | 20.4 | 20.3 | 2,000 | 30 |
| | 4 | 20.2 | 20.1 | 2,000 | 30 |
| | 5 | 21.2 | 21.1 | 2,000 | 10 |
| | 6 | 21.1 | 21.0 | 2,000 | 20 |
| | 7 | 21.0 | 20.9 | 2,000 | 10 |
| | 8 | 21.4 | 21.4 | 2,000 | 20 |
| | 9 | 21.0 | 20.8 | 2,000 | 10 |
| | 10 | 20.8 | 20.7 | 2,000 | 10 |
| | 11 | 20.1 | 20.0 | 2,000 | 10 |
| | 12 | 21.2 | 21.1 | 2,000 | 10 |
| | 13 | 21.5 | 21.4 | 2,000 | 10 |
| | 14 | 21.4 | 21.3 | 2,000 | 10 |
| Comparative Example | 1 | 20.5 | 20.3 | 2,000 | 60 |
| | 2 | 20.3 | 20.2 | 2,000 | 60 |
| | 3 | 21.2 | 21.0 | 2,000 | 60 |
| | 4 | 21.6 | 21.5 | 2,000 | 50 |
| | 5 | 21.1 | 21.0 | 2,000 | 50 |
| | 6 | 21.0 | 20.8 | 2,000 | 50 |
| | 7 | 20.9 | 20.9 | 2,000 | 90 |
| | 8 | 21.8 | 21.7 | 2,000 | 70 |
| | 9 | 21.9 | 21.8 | 2,000 | 70 |

[Light Transmission Test 1]

Using a spin coater, each photosensitive resin composition was coated onto a 8-inch glass wafer, which had been primed with HMDS, to form a film having the thickness shown in Table 2. The coated wafer was placed on a hotplate and heat dried at 100° C. for 5 minutes in order to remove the solvent from the composition.

Using a Mask Aligner MA8 (SUSS MicroTec AG), the film on the glass wafer was exposed over its entire surface to light of wavelength 360 nm from a high-pressure mercury lamp directly, i.e., not through a mask (flood exposure). The film was PEB and dipped in PGMEA. The film which remained after these operations was then heated in an oven at 190° C. for 2 hours, yielding a cured film. Using a spectrophotometer U-3900H (Hitachi High-Tech Science Corp.), the cured film was measured for transmittance with respect to light of wavelength 405 nm. The results are shown in Tables 3 and 4.

TABLE 3

| | Example | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Light transmittance (%) @ 405 nm | 99.2 | 99.3 | 99.0 | 99.0 | 99.2 | 98.1 | 99.2 | 98.2 | 99.0 | 99.0 | 99.4 | 99.2 | 99.9 | 99.0 |

TABLE 4

| | Comparative Example | | | | | | | | |
|---|---|---|---|---|---|---|---|---|---|
| | 1 | 2 | 3 | 4 | 5 | 6 | 7 | 8 | 9 |
| Light transmittance (%) @ 405 nm | 97.6 | 97.6 | 97.3 | 97.2 | 98.0 | 97.9 | 97.6 | 97.2 | 97.4 |

[Light Transmission Test 2]

In an oven at 140° C., the sample (having a film on glass wafer as above) was continuously irradiated with laser radiation of 405 nm and 1 W. Changes of transmittance after 100 hours and 1,000 hours of laser irradiation at wavelength 405 nm were determined, provided that the initial transmittance was 100%. The results are shown in Tables 5 and 6.

TABLE 5

| | Laser irradiation time | Example | | | | | | | | | | | | | |
|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 |
| Light transmittance (%) @ 405 nm | 100 hr | 99.0 | 99.1 | 98.7 | 98.8 | 99.0 | 93.2 | 99.1 | 93.2 | 98.2 | 97.1 | 99.2 | 99.0 | 99.8 | 98.2 |
| | 1,000 hr | 98.7 | 98.7 | 98.4 | 98.5 | 98.7 | 92.8 | 98.8 | 92.7 | 97.3 | 96.3 | 99.0 | 98.8 | 99.7 | 97.4 |

TABLE 6

| | Laser irradiation time | Comparative Example | | | | | | | | |
|---|---|---|---|---|---|---|---|---|---|---|
| | | 1 | 2 | 3 | 4 | 5 | 6 | 7 | 8 | 9 |
| Light transmittance (%) @ 405 nm | 100 hr | 85.4 | 86.4 | 76.4 | 75.8 | 80.4 | 80.9 | 87.9 | 83.2 | 86.7 |
| | 1,000 hr | 81.3 | 82.0 | 70.8 | 70.1 | 75.4 | 74.2 | 84.5 | 81.4 | 84.2 |

[Heat Resistance Test]

A silicon wafer sample was prepared by spin coating each photosensitive resin composition onto a silicon wafer, flood exposure, and PEB. The weight of the sample before the test was measured. The sample was held in an oven at 150° C. for 1,000 hours, after which the sample was taken out and measured for weight. A weight change before and after the test was computed as an index of heat resistance. The sample was rated good when the weight change after the test was less than 0.5% by weight and poor when the weight change was equal to or more than 0.5% by weight. The results are shown in Tables 7 and 8.

TABLE 7

| | Example | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Heat resistance | Good | Good | Good | Good | Good | Good | Good | Good | Good | Good | Good | Good | Good | Good |

TABLE 8

| | Comparative Example | | | | | | | | |
|---|---|---|---|---|---|---|---|---|---|
| | 1 | 2 | 3 | 4 | 5 | 6 | 7 | 8 | 9 |
| Heat resistance | Poor | Poor | Poor | Poor | Poor | Poor | Poor | Poor | Poor |

As is evident from the results, the photosensitive resin compositions within the scope of the invention form films (or coatings) which can be processed into a fine size pattern without any film thickness loss, indicating satisfactory properties as photosensitive material. In addition, the films have high light transmission, satisfactory light resistance and heat resistance and are thus useful as a material for photo-semiconductor devices.

Japanese Patent Application No. 2017-251774 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising
   (A) a dual end alicyclic epoxy-modified silicone resin having the formula (A1):

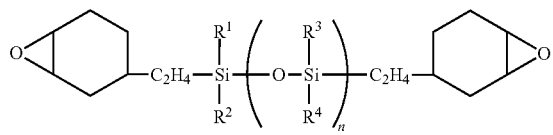

(A1)

wherein $R^1$ to $R^4$ are each independently a $C_1$-$C_{20}$ monovalent hydrocarbon group which may contain a heteroatom, n is an integer of 1 to 600, with the proviso that when n is an integer of at least 2, groups $R^3$ may be identical or different and groups $R^4$ may be identical or different, (B) a photoacid generator, and
   (C) an epoxy-containing silicone resin comprising repeating units having the following formulae (C1) to (C6):

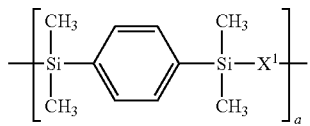

(C1)

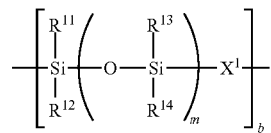

(C2)

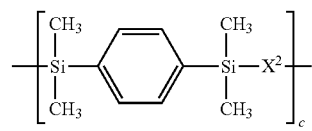

(C3)

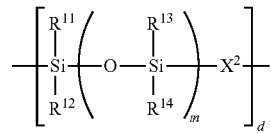

(C4)

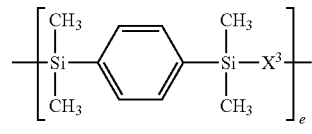

(C5)

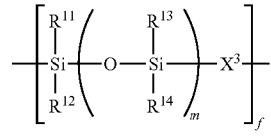

(C6)

wherein $R^{11}$ to $R^{14}$ are each independently a $C_1$-$C_{20}$ monovalent hydrocarbon group which may contain a heteroatom, m is each independently an integer of 1 to 600, with the proviso that when m is an integer of at least 2, groups $R^{13}$ may be identical or different and groups $R^{14}$ may be identical or different, a, b, c, d, e and f are numbers in the range: $0 \le a \le 1$, $0 \le b \le 1$, $0 \le c \le 1$, $0 \le d \le 1$, $0 \le e \le 1$, $0 \le f \le 1$, $0 < c+d+e+f \le 1$, and $a+b+c+d+e+f=1$, $X^1$ is a divalent group having the formula (X1):

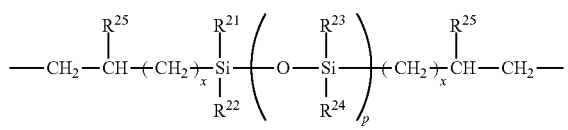

(X1)

wherein $R^{21}$ to $R^{24}$ are each independently a $C_1$-$C_{20}$ monovalent hydrocarbon group which may contain a heteroatom, p is an integer of 1 to 600, with the proviso that when p is an integer of at least 2, groups $R^{23}$ may be identical or different and groups $R^{24}$ may be identical or different, $R^{25}$ is each independently hydrogen or methyl, x is each independently an integer of 0 to 7, $X^2$ is a divalent group having the formula (X2):

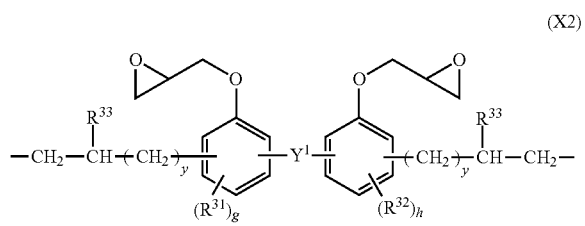
(X2)

wherein $Y^1$ is a single bond, methylene, propane-2,2-diyl, 1,1,1,3,3,3-hexafluoropropane-2,2-diyl, or fluorene-9,9-diyl, $R^{31}$ and $R^{32}$ are each independently a $C_1$-$C_4$ alkyl or alkoxy group, g and h are each independently 0, 1 or 2, with the proviso that groups $R^{31}$ may be identical or different when g is 2, and groups $R^{32}$ may be identical or different when h is 2, $R^{33}$ is each independently hydrogen or methyl, y is each independently an integer of 0 to 7, $X^3$ is a divalent group having the formula (X3):

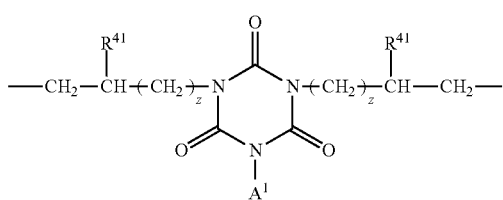
(X3)

wherein $R^{41}$ is each independently hydrogen or methyl, z is each independently an integer of 0 to 7, and $A^1$ is a monovalent group having the formula (X3-1) or (X3-2):

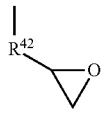
(X3-1)

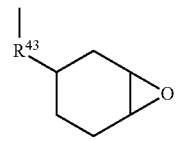
(X3-2)

wherein $R^{42}$ and $R^{43}$ are each independently a $C_1$-$C_8$ divalent hydrocarbon group in which an ester bond or ether bond may intervene between carbon atoms.

2. The photosensitive resin composition of claim 1 wherein $0<e+f\leq 1$.

3. The photosensitive resin composition of claim 1 wherein component (C) is present in an amount of 0 to 10,000 parts by weight per 100 parts by weight of component (A), and component (B) is present in an amount of 0.05 to 20 parts by weight per 100 parts by weight of components (A) and (C) combined.

4. The photosensitive resin composition of claim 1, further comprising (D) a solvent.

5. The photosensitive resin composition of claim 1, further comprising (E) an antioxidant.

6. A pattern forming process comprising the steps of:
 (i) coating the photosensitive resin composition of claim 1 onto a substrate to form a photosensitive film thereon,
 (ii) exposing the photosensitive film to radiation through a photomask, and
 (iii) developing the exposed film in a developer.

7. A method for fabricating an opto-semiconductor device involving the pattern forming process of claim 6, the device comprising the patterned photosensitive resin film.

8. The photosensitive resin composition of claim 1 wherein $0.2\leq a+c+e\leq 0.95$.

* * * * *